(12) United States Patent
Chevallier et al.

(10) Patent No.: US 7,054,198 B2
(45) Date of Patent: May 30, 2006

(54) FLASH MEMORY WITH FAST BOOT BLOCK ACCESS

(75) Inventors: Christophe J. Chevallier, Palo Alto, CA (US); Allahyar Vahidimowlavi, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/130,357

(22) Filed: May 16, 2005

(65) Prior Publication Data

US 2005/0207224 A1    Sep. 22, 2005

Related U.S. Application Data

(60) Continuation of application No. 10/726,084, filed on Dec. 2, 2003, now Pat. No. 6,937,519, which is a division of application No. 09/345,888, filed on Jul. 1, 1999, now Pat. No. 6,671,769.

(51) Int. Cl.
*G11C 16/04* (2006.01)
*G11C 16/06* (2006.01)
*G11C 8/00* (2006.01)

(52) U.S. Cl. .............. 365/185.18; 365/185.11; 365/185.23; 365/189.06; 365/189.09; 365/226; 365/230.03; 365/230.06; 365/230.08

(58) Field of Classification Search ............... 365/226, 365/185.18, 189.06, 189.09, 223, 185.11, 365/185.23
See application file for complete search history.

(56) References Cited

U.S. PATENT DOCUMENTS

| 4,999,813 | A | * | 3/1991 | Ohtsuka et al. ........ 365/185.18 |
| 5,339,279 | A | | 8/1994 | Toms et al. |
| 5,519,654 | A | | 5/1996 | Kato |
| 5,659,501 | A | | 8/1997 | Baldi et al. |
| 5,774,399 | A | | 6/1998 | Kwon |
| 5,956,283 | A | * | 9/1999 | Park .......................... 365/226 |
| 5,995,417 | A | | 11/1999 | Chen et al. |
| 6,018,479 | A | | 1/2000 | Jeong |
| 6,026,465 | A | | 2/2000 | Mills et al. |
| 6,094,095 | A | | 7/2000 | Murray et al. |
| 6,111,468 | A | | 8/2000 | Tanishima |
| 6,160,749 | A | | 12/2000 | Pinkham et al. |
| 6,255,896 | B1 | | 7/2001 | Li et al. |
| 6,289,449 | B1 | | 9/2001 | Aguilar et al. |
| 6,515,919 | B1 | * | 2/2003 | Lee ............................ 365/192 |
| 6,760,017 | B1 | | 7/2004 | Banerjee et al. |
| 2003/0048662 | A1 | * | 3/2003 | Park et al. ............. 365/185.18 |

OTHER PUBLICATIONS

"Flash Memory", *1998 Flash Memory Data Book,* Micron Quantum Devices, Inc., (1998), p. 1-1 to p. 1-27.

* cited by examiner

*Primary Examiner*—Amir Zarabian
*Assistant Examiner*—Ly Duy Pham
(74) *Attorney, Agent, or Firm*—Schwegman, Lundberg, Woessner & Kluth, P.A.

(57) ABSTRACT

A flash memory device and system include a boot block voltage pump for providing a word line voltage to the boot block of the flash memory. At least one additional voltage pump is provided to supply a word line voltage to the remaining memory blocks. The memory device can be operated according to a specification where data stored in the boot block can be read as valid data before data stored in other memory blocks can be validly read upon memory activation.

28 Claims, 5 Drawing Sheets

FLASH MEMORY WITH FAST BOOT BLOCK ACCESS

RELATED APPLICATIONS

This application is a Continuation of U.S. application Ser. No. 10/726,084, filed on Dec. 2, 2003; now U.S. Pat. No. 6,937,519 which is a Divisional of U.S. application Ser. No. 09/345,888, filed on Jul. 1, 1999, now issued as U.S. Pat. No. 6,671,769; each of which is incorporated herein by reference.

TECHNICAL FIELD OF THE INVENTION

The present invention relates generally to memory devices and in particular the present invention relates to fast access of a boot block in a flash memory device.

BACKGROUND OF THE INVENTION

Typical flash memories comprise a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

To read the memory cells, a voltage is applied to the gate of the memory cells. By changing the threshold voltage of the memory cell transistor, the level of activation of the transistor can be measured using sense amplifier circuitry. Flash memories have a typical word line voltage which is coupled to the memory cell transistor of about 5 volts during a read operation. In low voltage memory devices, a charge pump may be needed to raise a supply voltage to an acceptable word line voltage. For example, a charge pump is needed to raise a 3 volt power supply to a word line voltage of 5 volts.

The array of the flash memory devices typically is divided into multiple addressable blocks of memory cells. Each block of memory cells can store data used during system operations. For example, when the flash memory is used in a processing, or computer system, the memory can be used to store system boot instructions. The process of booting a processor comprises loading the first piece of software that starts the processor. Because an operating system is essential for running programs, it is usually the first piece of software loaded during the boot process.

System operation requires fast access to the boot data during power-up to maintain acceptable performance for the processing system. Currently, the entire flash memory array is provided with a word line voltage on power-up that is sufficient to read any memory cell in the flash memory for retrieving the boot data. This can create problems with low voltage memory devices.

For the reasons stated above, and for other reasons stated below which will become apparent to those skilled in the art upon reading and understanding the present specification, there is a need in the art for allowing fast reading of system boot information without requiring a large voltage pump circuit.

SUMMARY OF THE INVENTION

In one embodiment, a method of operating a flash memory, the method comprises activating the flash memory, and providing valid processor boot data on an output data connection of the flash memory within a first time period following activation of the flash memory. The valid processor boot data is stored in an addressable boot block of memory cells of the flash memory. The method also comprises providing second valid data on the output data connection within a second time period following activation of the flash memory. The second time period is greater than the first time period, and the second valid data is stored in a second addressable block of memory cells of the flash memory.

In another embodiment, a flash memory device comprises an array of addressable memory cells arranged in addressable blocks. The addressable blocks comprise a boot block and at least one additional memory cell block. The memory device further comprises a first address decoder circuit coupled to the boot block, a first voltage pump circuit coupled to the first address decoder circuit for providing a word line voltage signal to the boot block, a second address decoder circuit coupled to the additional memory cell block, and a second voltage pump circuit coupled to the second address decoder circuit for providing a word line voltage signal to the additional memory cell block.

DETAILED DESCRIPTION OF THE INVENTION

Figure 1:
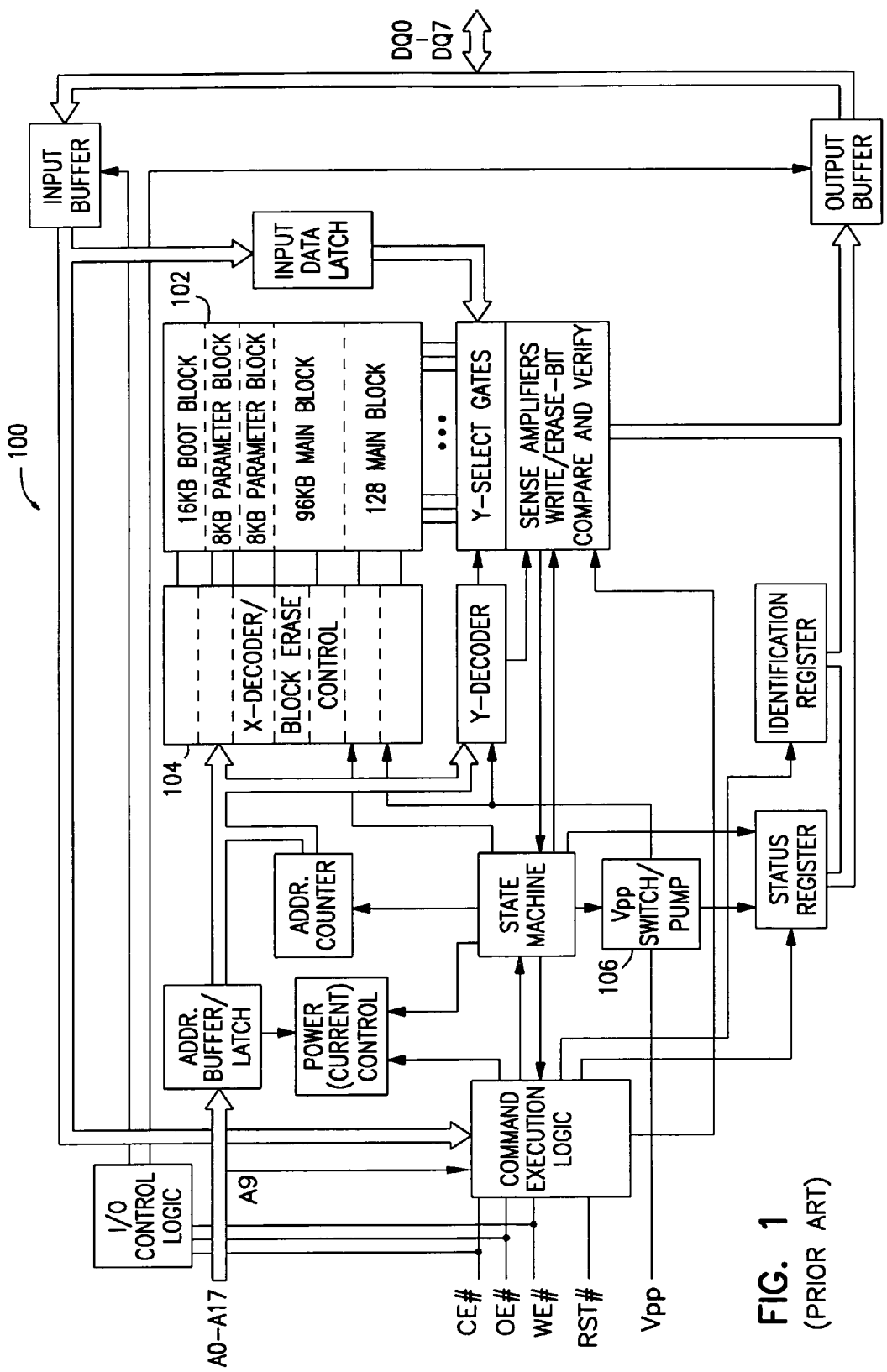
FIG. 1 is a block diagram of a prior art flash memory device.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Prior to describing the present invention, a description of a prior art memory device is provided. See "1998 Flash Memory Data Book," pages 1–1 to 1–27, available from Micron Technology, Inc., Boise, Id. for a description of a 265 k×8 boot block flash memory part No. MT28F002B1, and incorporated herein. This device is a non-volatile, electrically block-erasable, programmable read-only memory containing 2,097,152 bits organized as 262,144 words by 8 bits. Writing or erasing the device is done with either a 5 v or a 12 v Vpp voltage, while all operations are performed with a 3.3 v or 5 v Vcc. Writing or erasing the boot block requires either applying a super-voltage to a reset/power-down (RP*) pin or driving a write protect (WP*) input to a high state in addition to executing a normal WRITE or ERASE sequence. The boot block can be used to store code implemented in low-level system recovery. As illustrated, the flash memory device includes a number of external signal inputs, including but not limited to, chip enable (CE*), write enable (WE*), write protect (WP*), reset/power-down (RP*), and output enable (OE*). The memory device also has a plurality of address input connections and data input/output connections.

The memory device is organized into five independently erasable memory blocks that allow portions of the memory to be erased without affecting the rest of the memory data. The boot block is hardware-protected against inadvertent erasure or writings. To allow for maximum power conservation, the memory device features a low current, deep power-down mode. To enter this mode, the voltage on the RP* pin is taken to a high state. In this mode, the current draw is substantially reduced for the memory device.

Power-up is defined as the time when power (Vcc) is applied to the memory device, or when the external connection RP* receives an enable signal. This connection is often used to place the memory device in the low power consumption mode to conserve battery-power, in applications which use a battery for the power supply. Flash memory devices typically operate under a specification which defines timing requirements of the memory device. For example, one timing specification of the above described flash memory device is the time required to read valid data following power-up of the memory device. This specification time is often referred to as Twrh. A typical time specified for Twrh is about 600 ns. As explained above, flash memory devices often include a voltage pump which provides an elevated voltage signal to word lines for reading data stored in the flash memory cells. Prior art flash memory devices provide the elevated voltage to all memory cell locations. That is, the memory is designed to allow data to be read from any memory array location within the specified time by coupling the elevated voltage to desire memory cells.

A specific reason why fast read operations from the flash memory data is necessary, relates to applications where a processor needs to retrieve boot information. As known to those skilled in the art, the boot data can contain code necessary to instruct the microprocessor in loading its operating system (OS), or other necessary system programs.

Figure 2:
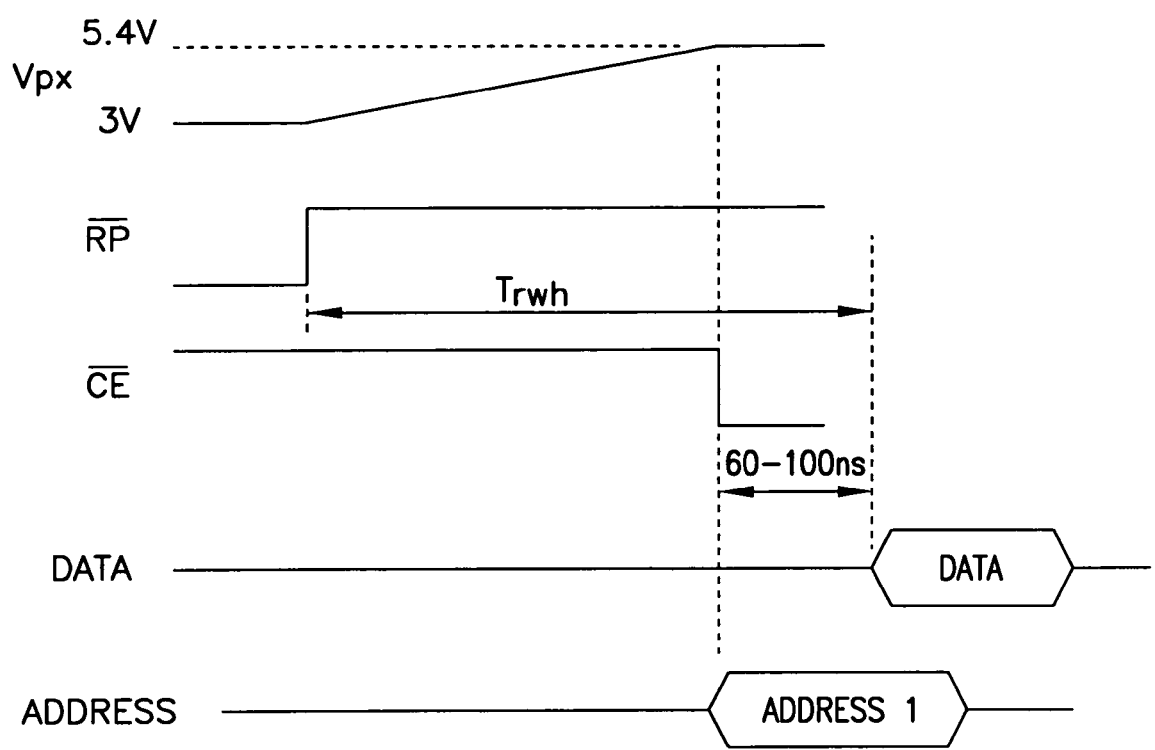
FIG. 2 is a timing diagram of the memory device of FIG. 1.

Referring to FIGS. 1 and 2, a representative prior art flash memory device is described. As illustrated in FIG. 1, the flash memory device 100 comprises an array 102 divided into addressable blocks. Each addressable block can be referred to as a separate array, or sub-array. Each block has a corresponding x-decoder circuit 104 which provides word line voltages to selective memory cells located within the block. As explained, the word line voltage is typically greater than a supply voltage of the device. The memory device, therefore, comprises a voltage pump circuit 106 which is coupled to the x-decoder circuitry. As shown in FIG. 2, a supply voltage of 3 volts is pumped to a word line voltage of about 5.4 volts when an enable signal is coupled to a reset pin, RP*. In a typical flash memory device, data stored in any memory cell location can be read within 60–100 ns following an active chip enable (CE*) signal with a Trwh of 600 to 1000 ns, or more. As such, the elevated word line voltage, 5.4 volts, must be available when the cell location is accessed which follows when the chip enable signal is activated.

In large density memory devices, a load capacitance (x-decoder and wiring to the x-decoder) which must be driven by the voltage pump is substantially large when compared to the time allocated for providing the elevated voltage to each memory block x-decoder. For example, in one embodiment of a 64 M memory device, a load capacitance is 1 nF can be expected. This is substantially higher than the expected load capacitance of 300 pF of the memory of FIG. 1.

It will be appreciated by those skilled in the art after studying the present disclosure, that a voltage pump circuit capable of driving this large load capacitance during the short time periods would not be economically feasible to fabricate on an integrated circuit. Further, as a supply voltage for the memory device is decreased and microprocessor speeds increase, the difficulties in providing fast word line voltages to all memory cell locations increases.

Figure 3:
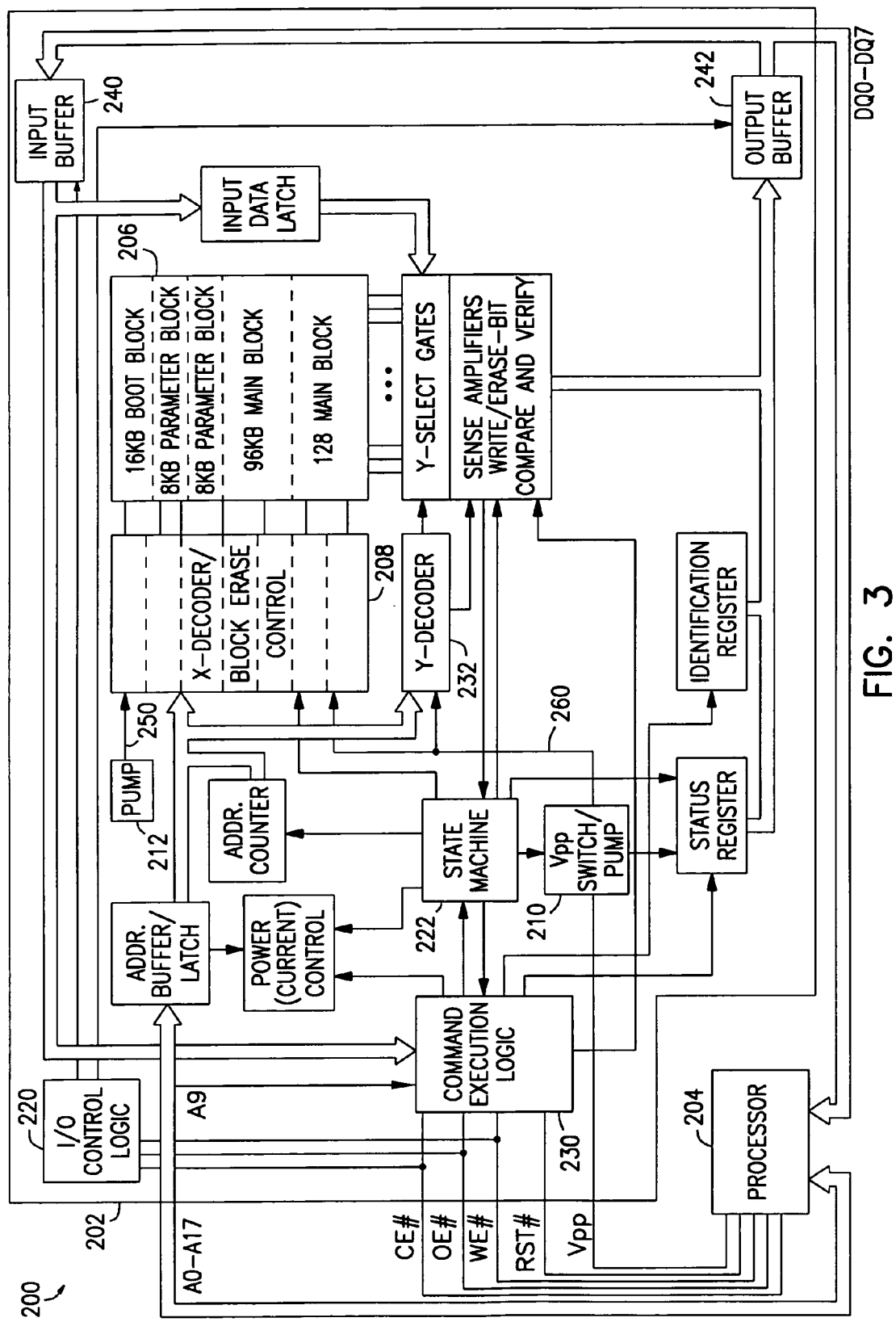
FIG. 3 is a block diagram of a system and flash memory device according to one embodiment of the present invention.
Figure 4B:
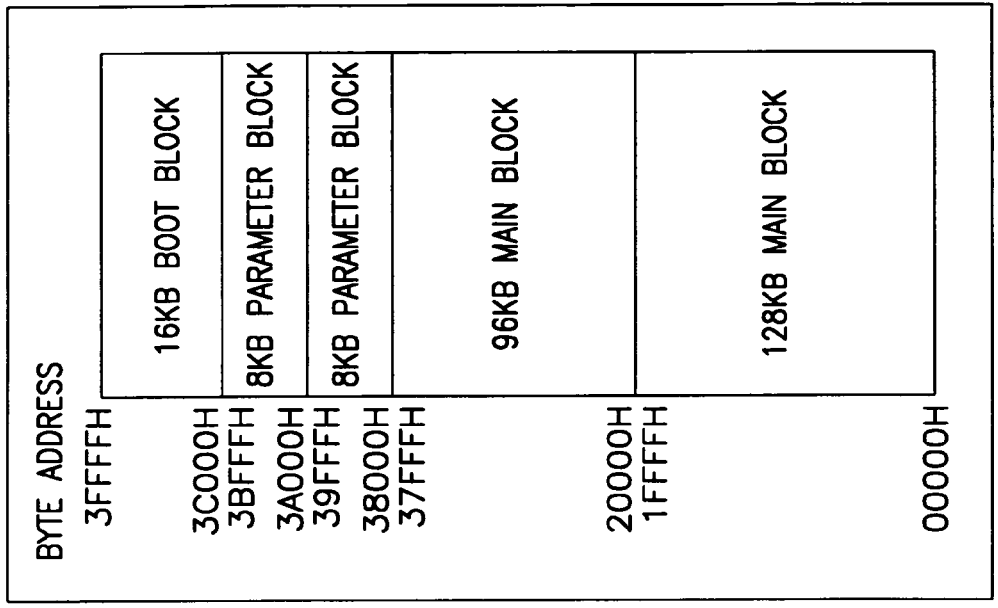
FIGS. 4*a* and 4*b* illustrate alternate memory maps of a memory array of the present invention.
Figure 4A:
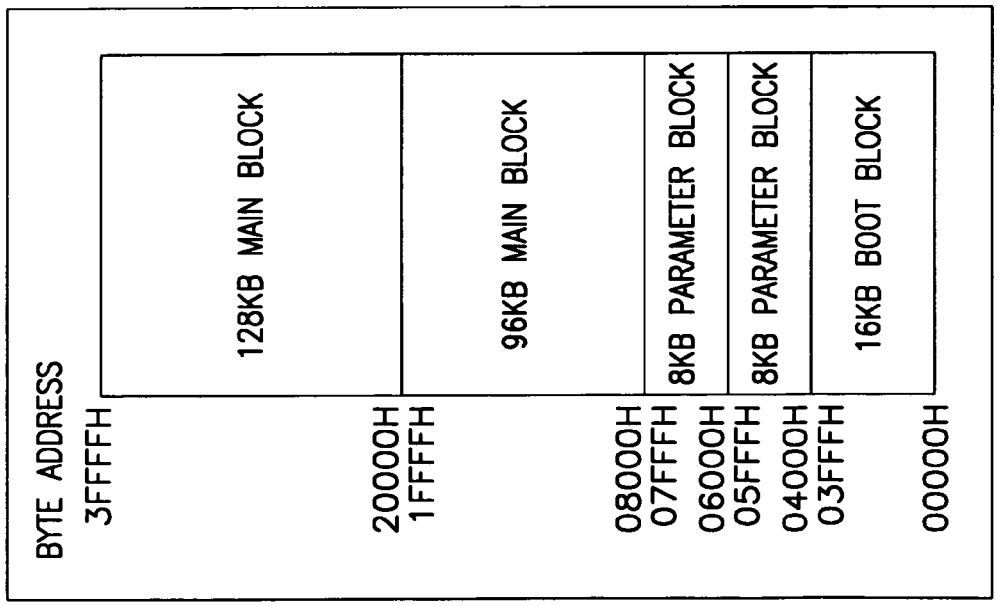
Figure 5:
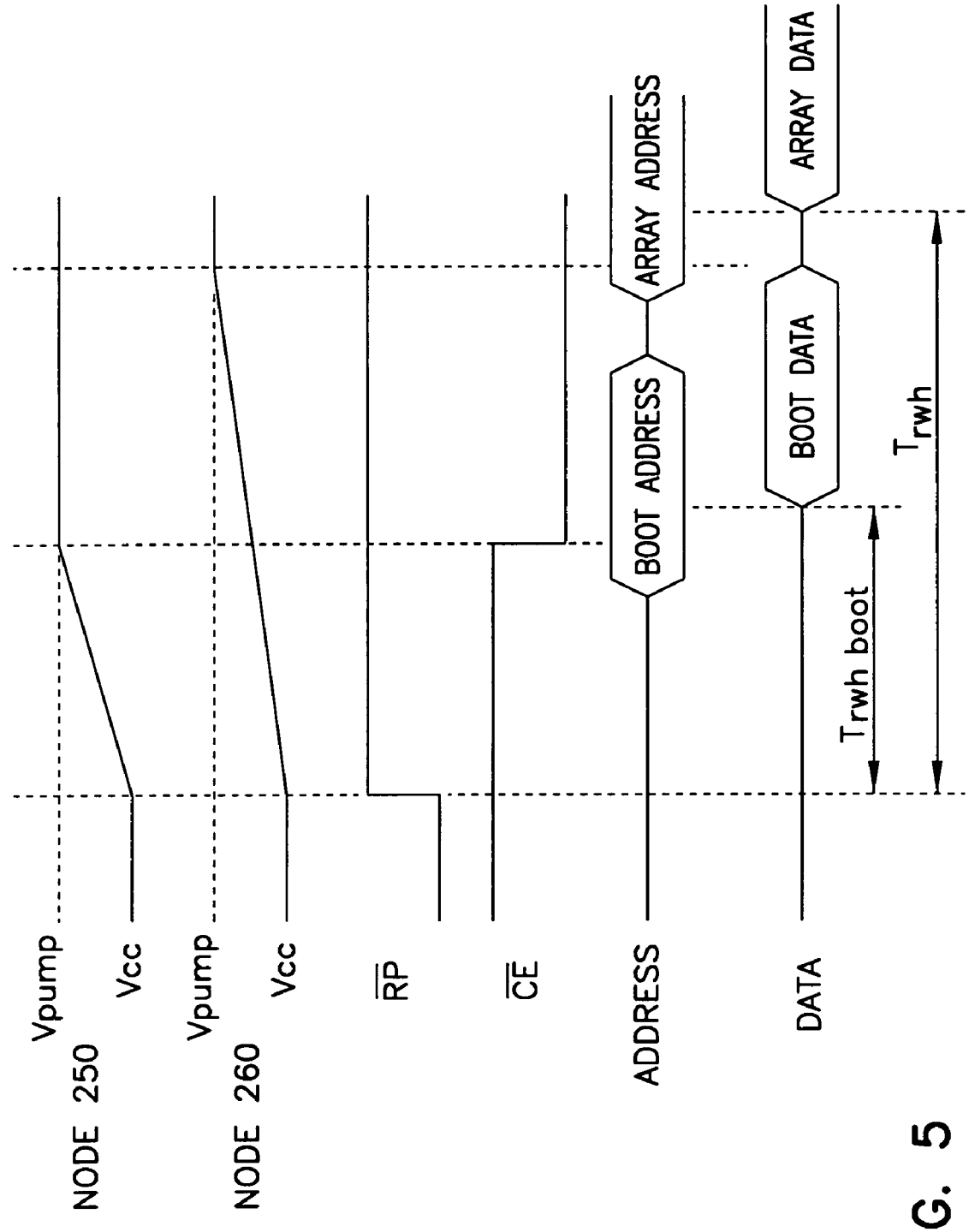
FIG. 5 is a timing diagram of the memory device of FIG. 3.

Referring to FIGS. 3–5, a flash memory system 200 according to one embodiment of the present invention is described. As illustrated in FIG. 3, the flash memory device 202 is coupled to a processor 204. The memory device includes a plurality of memory cell arrays 206 and corresponding x-decoders 208. The memory cell arrays can be illustrated at shown in FIGS. 4a and 4b as a memory map of the entire memory system. FIG. 4a illustrates a memory map having a bottom boot block. That is, the bottom 16 kB of the memory array is dedicated to boot data. FIG. 4b illustrates a memory map having a top of boot block, where the top 16 kB of the memory array is dedicated to boot data.

For illustration, the embodiment with a bottom boot block includes a boot block of memory cell locations beginning at 00000H and ending at 03FFFH. Where memory address 0000H is typical the first address accessed buy a processor. The actual size of the boot block can vary, and is not limited to 16 kB. Either of these memory map locations can be used as a boot block start address location when the memory cell is coupled to a microprocessor device, in a processing system. As such, the microprocessor reads one of these locations to receive boot address data.

The flash memory device of the present invention includes at least two voltage pump circuits. The first voltage pump circuit 212 is coupled to the x-decoder of the boot block of the flash memory device. The second voltage pump circuit 210 is coupled to the remaining x-decoder circuits to provide word line voltages to the remaining memory device array locations. That is, fast boot data read times can be maintained by providing a separate voltage pump circuit for the flash memory boot location. In one embodiment, the voltage pump is not fully powered-down during the deep power-down mode.

The memory also contains I/O logic 220, a state machine 222, Command Execution Logic 230, Y-select gate circuitry 232, Input 240 and Output buffers 242, and other circuitry required to operate the memory device. This circuitry is known in the art, and is not further described herein.

In operation, when the flash memory experiences a power-up both voltage pumps are activated. Because the first voltage pump is dedicated to the boot block location, and the load capacitance for that x-decoder is relatively minimal, the word line voltage on node 250 provided by voltage pump 212 reaches its required level (Vpump) much quicker than word line voltages on node 260 for the remaining memory cell locations, see FIG. 5. As such, access to boot data stored in the flash memory device of the present invention can be accessed more quickly than boot data stored in a prior art flash memory device, even though the present memory device may be fabricated to have a larger density than the prior art flash memory device. For example, boot data stored in one embodiment of the flash memory device of the present invention can be read (Trwh boot) within about 300 ns. This time could be reduced following power-up from the power-down mode if the boot block voltage pump was not powered down. The remaining memory blocks (Trwh) could be read after the boot data for example within about 2000 ns because a smaller pump is used for the remaining memory blocks.

CONCLUSION

A flash memory device has been described which includes a boot block voltage pump for providing a word line voltage to the boot block of the memory. At least one additional voltage pump is provided to supply a word line voltage to the remaining memory blocks. The memory device can be operated according to a specification where data stored in the boot block can be read as valid data before data stored in other memory blocks can be validly read.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A flash memory, comprising:
a memory array including a boot block and a memory block;
a decoder circuit coupled to the memory array;
a boot-block voltage pump connected to the decoder circuit and adapted to provide a first voltage signal to the boot block; and
a memory-block voltage pump connected to the decoder circuit and adapted to provide a second voltage signal to the memory block.

2. The flash memory of claim 1, wherein the boot-block voltage pump provides the first voltage signal within a first time period, and the memory-block voltage pump provides the second voltage signal within a second time period that is greater than the first time period.

3. The flash memory of claim 2, wherein the first time period is less than 300 nanoseconds.

4. The flash memory of claim 2, wherein the second time period is less than 2000 nanoseconds.

5. The flash memory of claim 1, wherein the boot-block voltage pump is adapted to receive a voltage supply of approximately three volts.

6. The flash memory of claim 1, wherein the boot-block voltage pump is adapted to generate a voltage signal of approximately five volts.

7. The flash memory of claim 1, wherein the memory-block voltage pump is adapted to receive a voltage supply of approximately three volts.

8. The flash memory of claim 1, wherein the memory-block voltage pump is adapted to generate a voltage signal of approximately five volts.

9. The flash memory of claim 1, wherein the boot-block includes 16 kB of memory.

10. A flash device, comprising:
a decoder circuit;
a boot-block voltage pump in communication with the decoder circuit and adapted to provide a first voltage signal to a boot block of a memory array; and
a memory-block voltage pump in communication with the decoder circuit and adapted to provide a second voltage signal to a memory block of the memory array.

11. The flash device of claim 10, wherein the boot-block voltage pump provides the first voltage signal within a first time period, and the memory-block voltage pump provides the second voltage signal within a second time period that is greater than the first time period.

12. The flash device of claim 11, wherein the first time period is less than about 300 nanoseconds, and wherein the second time period is less than about 2000 nanoseconds.

13. The flash device of claim 10, wherein the second time period is at one order of magnitude greater than the first time period.

14. A flash memory, comprising:
a memory array including a plurality of blocks including one boot block;
a decoder circuit coupled to the memory array;
a boot-block voltage pump adapted to provide a boot block access signal to the boot block; and
a memory-block voltage pump connected to the decoder circuit and adapted to provide a second voltage signal to the memory array.

15. The flash memory of claim 14, wherein the boot-block voltage pump is connected to the decoder circuit.

16. The flash memory of claim 14, wherein the decoder circuit includes dedicated boot-block address circuits.

17. The flash memory of claim 14, wherein the boot-block begins at the 00000H address in the memory array.

18. The flash memory of claim 14, wherein the memory array includes a plurality of sub-arrays individually addressable by the decoder circuit.

19. The flash memory of claim 14, wherein the plurality of blocks further includes at least one main block and at least one parameter block.

20. The flash memory of claim 19, wherein the boot block is accessed faster than the main block and the parameter block.

21. The flash memory of claim 14, wherein the boot-block voltage pump adapted to only output an increased voltage boot block access signal.

22. A flash memory device, comprising:
a memory array including at least a boot block and a memory block;
a decoder circuit coupled to the memory array;
a control circuit coupled to the decoder circuit;
a boot-block voltage pump connected to the decoder circuit and adapted to provide a first voltage signal to the boot block; and
a further voltage pump connected to the decoder circuit and adapted to provide a second voltage signal to at least the memory block.

23. The flash memory device of claim 22, wherein the boot-block voltage pump provides faster access to the boot block than the memory block.

24. The flash memory device of claim 22, wherein the boot-block voltage pump is larger than the further voltage pump.

25. The flash memory device of claim 22, wherein the boot-block voltage pump is always at least partially powered.

26. The flash memory device of claim 22, wherein the control circuit includes an address buffer connected to the decoder circuit and in communication with a plurality of address lines.

27. The flash memory device of claim 26, wherein the decoder circuit include an X-decoder circuit and a Y-decoder circuit each in communication with the address buffer.

28. The flash memory device of claim 27, wherein the control circuit includes command execution logic, a state machine in communication with the command execution logic, and wherein the state machine is in communication with the further voltage pump.

* * * * *